United States Patent [19]

Villemont et al.

[11] 4,382,271

[45] May 3, 1983

[54] ELECTRICAL AND THERMAL INTERCONNECTION SYSTEM FOR ELECTRONIC CIRCUIT BOARDS AND AN ELECTRICAL CABINET FITTED WITH SUCH A SYSTEM

[75] Inventors: Claude M. Villemont; Hervé G. P. M. Bricaud; Pierre Hamaide, all of Paris, France

[73] Assignee: Socapex, Suresnes, France

[21] Appl. No.: 241,429

[22] Filed: Mar. 6, 1981

[30] Foreign Application Priority Data

Mar. 7, 1980 [FR] France ............................ 80 05198

[51] Int. Cl.³ ............................................. H05K 7/20
[52] U.S. Cl. ................................... 361/386; 361/415; 339/112 R
[58] Field of Search ......... 211/41; 339/17 LM, 17 M, 339/112 R, 74 R, 75 MP; 361/386, 388, 361/412–415

[56] References Cited

U.S. PATENT DOCUMENTS

| 4,082,407 | 4/1978 | Smorzaniuk | 339/112 R |
| 4,266,839 | 5/1981 | Aikens | 339/75 MP |
| 4,314,311 | 2/1982 | Seyte et al. | 339/112 R |
| 4,318,157 | 3/1982 | Rank | 339/75 MP |
| 4,322,776 | 3/1982 | Job et al. | 361/386 |

Primary Examiner—G. P. Tolin
Attorney, Agent, or Firm—Roland Plottel

[57] ABSTRACT

An interconnection system, both electrical and thermal, allowing improved evacuation of the thermal dissipation of printed-circuit boards.

It comprises zero insertion force electrical and thermal connectors such as (67) and (69) of the plug-in type, which are applied by their metallic bases to one of the metallic layers of the mother boards (60) and (61), and other connectors of the same type, such as (68) and (70), which are applied by their bases to the other external layer of these mother boards (60) and (61). The mother boards are inclined, sloping downwards from the front panel or door (63) to the rear part (64) of a cabinet.

Application: racks and cabinets for electrical and telecommunication equipment.

8 Claims, 6 Drawing Figures

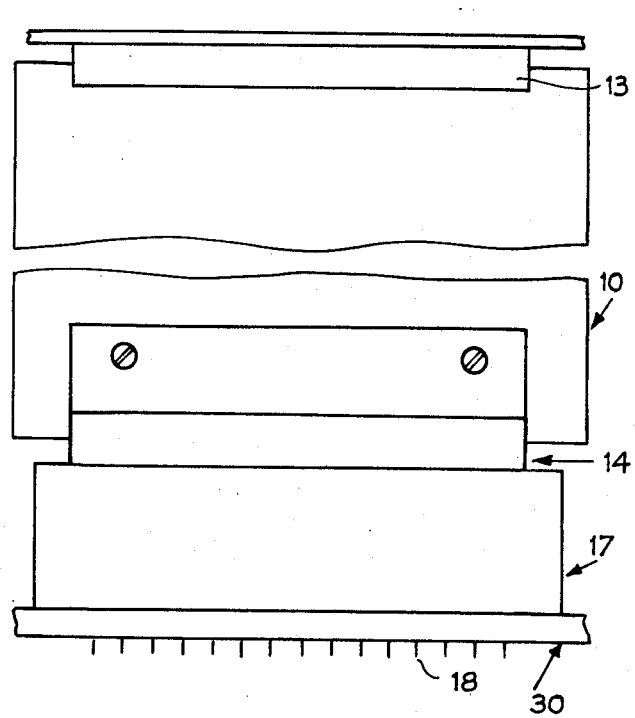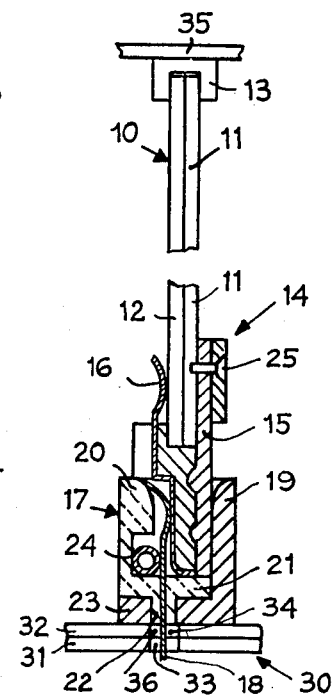
Fig. 1a    Fig. 1b
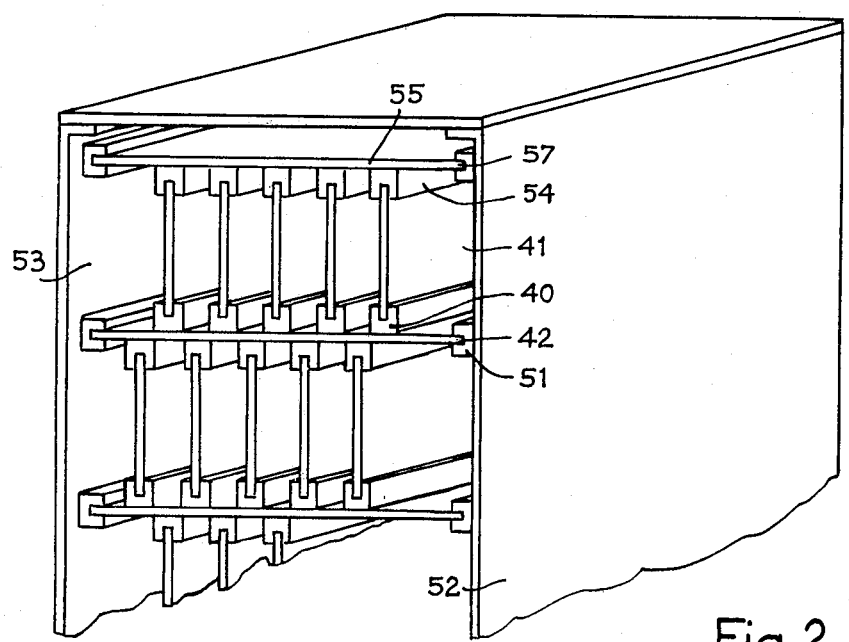
Fig. 2

ELECTRICAL AND THERMAL INTERCONNECTION SYSTEM FOR ELECTRONIC CIRCUIT BOARDS AND AN ELECTRICAL CABINET FITTED WITH SUCH A SYSTEM

The present invention relates to an electrical and thermal interconnection system for boards carrying electronic circuits and the electrical cabinet assembly of such a system.

In the case of electrical equipment in the form of cabinets or racks, the components constituting the electronic apparatus are often installed on electrically interconnected printed-circuit boards. These boards are generally flat and rectangular in shape. In order to reduce the size of a cabinet, for example, these boards must be installed in the smallest possible space inside this cabinet.

This obviously implies that adequate ventilation can be provided for components mounted on the boards, whose thermal dissipation in the cabinet may, for example, represent several hundred watts or more.

Both natural convection and blown cooling require air passages, ducts and hot air outlet cross-sections compatible with the thermal dissipation.

One method of evacuating the heat produced by boards consists in connecting the latter to radiators or cooling fins. Better evacuation of thermal dissipation may be obtained by using boards with printed or etched conductors possessing a heat sink constituted by a metallic layer. Thermal contacts may also be established between the boards and slides or metallic board guides fixed in the equipment frame.

In order to allow higher thermal dissipation on printed-circuit boards and also in order to save additional space inside a cabinet especially for providing more efficient cooling air passages, the subject of the present invention is an electrical and thermal interconnection system based on the application of electrical and thermal connectors comprising thermal conduction means.

Such connectors are referred to hereinafter as electrical and thermal connectors. They have been designed to evacuate in particular part of the thermal energy produced or transmitted by an electrical circuit mounted on a support. They comprise thermal energy conductors, which are electrically insulated with respect to the electrical connection conductors of the connector, and which establish thermal connections with a part of a board carrying an electrical circuit which is electrically connected to the electrical connection conductors.

The thermal conductor is advantageously constituted by a relatively large part or fraction of the connector body and manufactured from material with high thermal conductivity, such as metal or ceramic.

These electrical and thermal connectors are preferably of the zero insertion force type, applicable to plug-in boards.

Another purpose of the present invention is to eliminate the necessity in electrical cabinets of subracks and nest in which printed-circuit boards are frequently mounted, and also to replace at least certain board guides by such electrical and thermal connectors.

Another purpose of the present invention is also to facilitate the establishment of the main electrical connections of boards by preferably installing connectors of the type mentioned above on the side edges of the boards instead of on their front and rear edges.

These results are obtained by means of an electrical and thermal interconnection system for electronic circuit boards installed in an electrical cabinet comprising at least one mother board constituted by an insulating support with printed conductors and two outer metallic layers insulated from the conductors, and which is carried by slides attached to the side walls of the cabinet, rectangular daughter boards comprising a thermal collector, including in addition zero insertion force electrical and thermal connectors, each comprising electrical connection conductors and thermal conduction means, these conduction means being constituted by a metallic base and a metallic longitudinal wall, these connectors being applied by their bases to a metallic external layer of at least one mother board, other electrical and thermal connectors of this type being mounted by their metallic bases onto the other external layer of this mother board, wherein the daughter boards comprising a thermal collector are each engaged by at least one side edge in an electrical and thermal connector such that the thermal collector of a daughter board is applied against the surface of the longitudinal metallic wall of a single electrical and thermal connector, the connection conductors of these connectors being connected electrically to the printed conductors of the daughter boards and the mother board.

This system includes at least one electrical connector comprising a thermal collector and electrical conductors which are connected to the printed conductors of a daughter board and via the electrical connection conductors of an electrical and thermal connector to the printed conductors of at least one mother board, this connector being connected thermally by its thermal collector to a thermal energy conductor of the electrical and thermal connector, the latter being mounted by its base on this mother board.

The system is again notable in that at least one mother board is inclined in a descending plane from front to rear of an electrical cabinet and in that the electrical and thermal connectors into which are engaged the daughter boards are mounted on the mother board such that the planes of these daughter boards are oriented front-to-rear.

The purposes and characteristics of the present invention appear more clearly from the following description of practical embodiments, said description referring to the appended drawings in which:

FIG. 1a is an elevation view of part of the electrical and thermal interconnection system in accordance with the invention;

FIG. 1b is a transversal section through the drawing of FIG. 1a;

FIG. 2 is a perspective view of an electrical cabinet possessing an electrical and thermal interconnection system in accordance with the invention;

Figure 3:
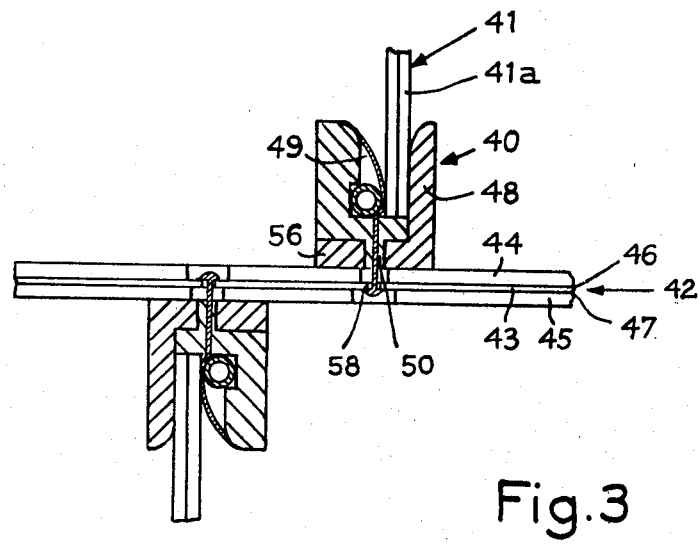
FIG. 3 shows the assembly of electrical and thermal connectors with an electrical circuit board in greater detail.

FIGS. 1a and 1b show a rectangular electrical circuit board 10, consisting typically of a flat insulating support 12 and a thermal collector 11. A circuit of electrical conductors is printed on support 12 and connected to electronic or electrical components (not shown) carried by the board 10. The thermal collector consists of a metallic layer 11 which adheres to the insulating support 12.

The board 10 is installed vertically with its top longitudinal edge in the groove of a slide 13. Part of the bottom longitudinal edge is attached to a connector 14. The thermal conductor 15 of this connector 14 is attached by appropriate means, such as a screw 25, to the external surface of the metallic layer 11 of the board 10. It consists preferably of a rectangular metallic plate. The connector is inserted in the insertion duct of a zero insertion force electrical and thermal connector 17, such that the connecting conductors 16 of this connector 14 are in contact with the connecting conductors 18 of the electrical and thermal connector 17. The thermal conductor 15 of the connector 14 is applied against a metallic wall 19 of connector 17 in order to transmit the heat from the board 10 to the wall 19.

The connection conductors 18 of connector 17 are electrically insulated from the metallic wall 19 by an insulating longitudinal flange formed by the angle of a high wall 20 and a transversal wall 21. The wall 21 comprises a rectangular-section longitudinal protrusion 22. This protrusion fits into a hole provided in a metallic base 23 placed under the insulating transversal wall 21. The base 23 is perpendicular to the wall 19, constituting the thermal conductor assembly of connector 17.

This connector 17 is fitted with a rotating cam device 24 of the type which presses the flexible top ends of the connection conductors 18 against the electrical conductor 16 of the plug 14 engaged in the insertion duct of the electrical and thermal connector 17.

The bottom ends of the conductors 18 of connector 17 exit from the longitudinal protrusion 22 and are soldered to conductors of a network of conductors (not shown) printed or etched on the external surface of an insulating support 31 of a board 30. This board thus possesses a metallic support 32, of which one surface adheres totally to the insulating support 31. The metallic base 23 of connector 17 is applied to the external surface of the metallic support 32 of the board.

Holes 33 and 36 of appropriate dimension are drilled in supports 31 and 32 respectively to let through conductors 18. The insulation of conductors 18 with respect to the edges of the holes drilled in the metallic support 32 may be provided by rings 34 inserted in the holes, but these are not necessary if the ends of conductors 18 are covered by an insulating sleeve, over the length at the level of the internal edges of holes 36, and also if holes 36 are of sufficient diameter to avoid unwanted electrical contact with the metallic support 32.

The slide 13 may consist of a metallic U-strip or a plastic moulded U-strip. The top edge of board 10, which is in contact with the groove of the slide is preferably without electrical conductors. This slide 13 is attached opposite the groove on a rigid metallic plate 35, which is placed, for example, horizontally inside an electrical cabinet.

The electrical and thermal interconnection system described above allows the transfer of heat due to the operation of the circuit on board 10 to the metallic support 32 of the board 30 and also to the slide 13 and the plate 35, if these last two parts are metallic.

Heat is transferred to the metallic support 32 of the board 30 by means of existing surface contacts between the thermal collector 11 of the board 10 and the external conductor 15 of connector 14, between this thermal conductor 15 and the wall 19, and between the base 23 and the metallic support 32 of the board 30.

The advantage of the system described above is that the electrical circuits mounted on the boards can be better cooled following the transfer of part of the heat to the relatively large metallic surfaces which act as cooling fins.

It may be observed (FIG. 1a) that no electrical connection exists either at the front or rear of the board 10 on its vertical edges with the printed conductors on the board 10, since the electrical connections of board 10 are mainly via the electrical and thermal connector 17 connected to a longitudinal edge of the board 10.

FIG. 2 is a perspective view of the top part of an electrical cabinet fitted, for example, with an electrical and thermal interconnection system in accordance with the present invention. In this example, the system comprises zero insertion force electrical and thermal connectors 40. These connectors 40 are arranged to act at the same time as board guides for the printed-circuit boards 41 on which are mounted electrical or electronic components (not shown).

FIG. 3 shows in detail how connectors 40 are mounted on a 3-layer board 42 of known type. Such a board 42 is constituted by two metallic external layers 44 and 45 and a support 43 of insulating material sandwiched between the two external layers 44 and 45. Both sides of support 43 carry printed or etched electrical conductors, which may be interconnected as required by the user by means of holes (not shown) drilled through the support 43.

The network of conductors on each side of support 43 is separated from its neighbouring metallic layer by films 46 and 47 made of electrically insulating material.

Boards 41 are placed vertically in the cabinet. Each has a metallic support 41a, which is in direct contact by a large surface of its edge inserted in the connector 40 with a metallic wall 48 of this connector.

The electrical connection conductors 49 are buried in a longitudinal protrusion 50 made of insulating material, and are consequently electrically isolated from the metallic base 56 of the connector 40. The ends of the conductors 49 pass through holes 58 in the support 43 and are soldered to the printed conductors on one of the surfaces of the insulating support 43. The holes 58 open for a row of conductors 49 between the positions of the metallic bases of the two electrical and thermal connectors mounted on the other side.

FIG. 2 shows that board 42 is inserted by its longitudinal edges in the slots of slides 51 fixed to the internal surfaces of the vertical and lateral walls 52 and 53 respectively of a cabinet. These walls and the slides are preferably metallic, allowing the transfer of heat from the vertical boards 41 to these walls and slides via connectors 40 and the metallic supports 44 and 45 of the horizontal board 42.

The vertical boards 41 are here engaged by their top edges in other electrical and thermal connectors 54 of the same type as connectors 40. These connectors are electrically connected as required to the printed conductors of a board 55, which can be either of the type of board 42 (FIG. 3) or of the type of board 30 (FIG. 1b) and which is supported horizontally by slides 57 attached to the walls 52 and 53.

The structure of the electrical and thermal interconnection system described above perfectly illustrates a new concept of electrical cabinet and rack architecture in which are associated electrical circuit boards commonly known as mother boards and daughter boards, with the electrical and thermal connectors described in the present patent application.

Figure 4:
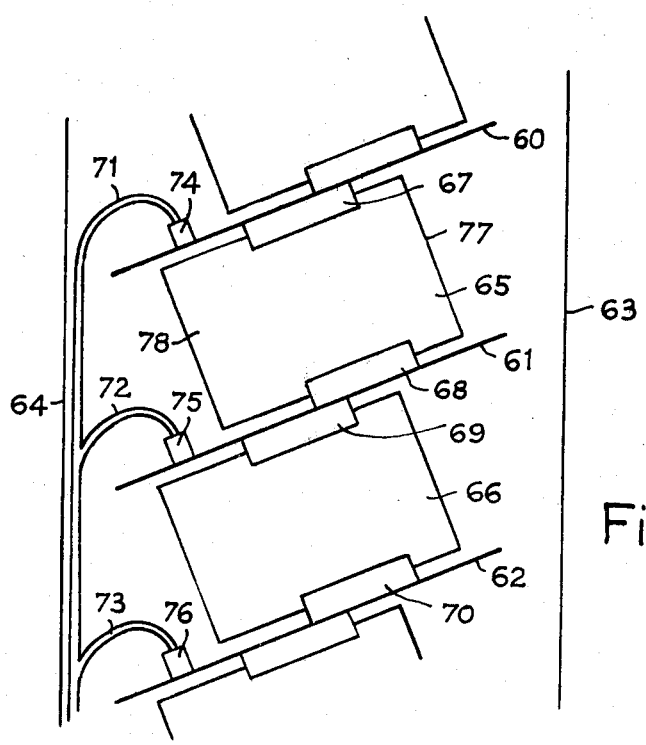
FIG. 4 is a schematic representation of another possible embodiment of an electrical and thermal interconnection system in accordance with the invention.

FIG. 4 schematically represents another practical embodiment of the system in accordance with the present invention, where the mother boards are no longer located horizontally, but inclined in an electrical cabinet.

Mother boards 60, 61 and 62 are represented as an example parallel to each other and inclined towards the rear from a front panel 63 towards a wall or a rear door 64 of an electrical cabinet.

Electrical and thermal connectors of the type shown in FIG. 3 are mounted on both sides of mother boards 60, 61 and 62, and daughter boards 65 and 66 are inserted vertically into the pairs 67, 68 and 69, 70 of such electrical and thermal connectors.

The electrical power supplies of this system are connected by the electrical cables 71, 72 and 73, which are terminated by electrical connectors 74, 75 and 76 respectively, plugged directly into the mother boards 60, 61 and 62, preferably in areas of the mother boards located nearer the door or the rear wall 64 of the cabinet.

FIG. 4 shows that in this example there are no electrical connectors mounted on a front edge 77 or a rear edge 78 of a board 65 or 66 but these rear and front edges nevertheless remain available for temporary connections, such as test sockets.

It is also seen that no other component except for the cables is located in front or behind the mother board 60, 61 and 62. This leaves considerable free space in the electrical cabinet between boards 65 and 66 and the front panel or door 63 and the rear door or wall 64.

These spaces constitute ventilation ducts through which the air heated by the electrical circuits can be quickly evacuated. Evacuation is still further facilitated by the inclined position of mother boards 60, 61 and 62, the hot air tending in this case to flow more rapidly towards the top of the cabinet than if these mother boards were horizontal.

Figure 5:
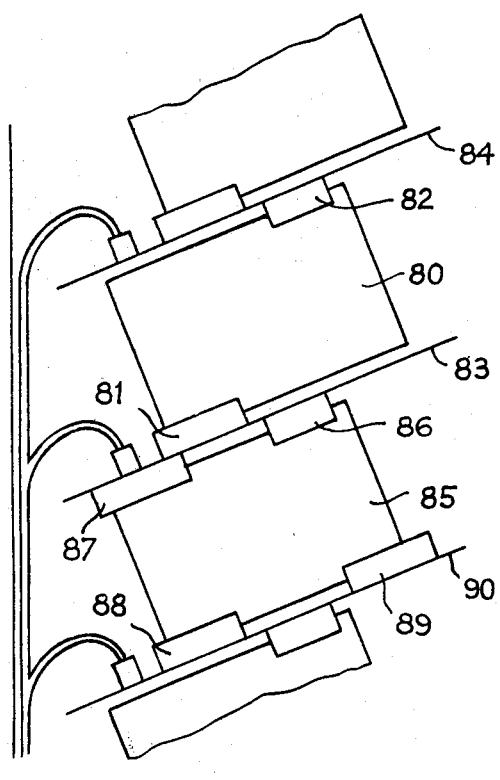
FIG. 5 is a schematic representation of a variant of the system shown in FIG. 4.

Because of the favourable position of these connectors 67, 68, 69 and 70, the control of a system locking these electrical and thermal connectors, such as by rotating a cam, is rendered simpler since it can be operated from the front panel or door instead of from the rear of the cabinet. In certain cases, it may be preferable as shown in FIG. 5 to replace one of the two electrical and thermal connectors connected to a vertical daughter board 80 by a metallic or insulating slide 81. For example, slide 81 may be installed on the top surface of an inclined mother board 83, and a zero insertion force electrical and thermal connector 82 can be mounted on the bottom surface of a mother board 84 inclined parallel to the mother board 83. If relatively long daughter boards are used, another metallic or possibly insulating slide 87 is mounted as shown on a mother board 83 in line with a connector 86 mounted on this board.

In addition, two other slides 88 and 89 are mounted on the top surface of an inclined mother board 90 and placed at an appropriate distance beneath the mother board 83. In this manner, a daughter board 85 can be simultaneously guided, supported and connected. Stops (not shown) are also provided behind the slides 87 and 88 to prevent the daughter board 85 from falling out of the slides.

What is claimed is:

1. An electrical and thermal interconnection system for electronic circuit boards arranged in a cabinet, comprising at least one mother board constituted by an insulating support with printed conductors and two external metallic layers isolated from these conductors, and which is carried by slides attached to the side wall of the cabinet, rectangular daughter boards comprising a thermal collector, including in addition: zero insertion force electrical and thermal connectors each comprising electrical connection conductors and thermal conduction means, these conduction means being constituted by a metallic base and a metallic longitudinal wall, these connectors being applied by their bases to an external metallic layer of at least one mother board, other electrical and thermal connectors of this type being mounted by their metallic bases onto the other external layer of this mother board, and wherein the daughter boards comprising a thermal collector are each engaged by at least one longitudinal edge in an electrical and thermal connector such that the thermal collector of a daughter board is applied against the surface of the longitudinal metallic wall of a single electrical and thermal connector, the connection conductors of these connectors being connected electrically to the printed conductors on the daughter boards and mother board.

2. A system in accordance with claim 1, wherein it comprises at least one electrical connector possessing a thermal collector and electrical conductors which are connected to the printed conductors of a daughter board, and via the electrical connection conductors of an electrical and thermal connector to those of at least one mother board, this connector being connected thermally by its thermal collector to a thermal conductor of the electrical and thermal connector, the latter being mounted by its base on the mother board.

3. A system in accordance with claim 1 or 2, wherein at least one mother board is inclined, sloping downwards from front to rear in an electrical cabinet, and wherein electrical and thermal connectors into which are engaged the daughter boards are mounted on the mother board such that the planes of these daughter boards are oriented front-to-rear.

4. A system in accordance with any of claims 1 or 2, wherein the electrical and thermal connectors comprise connection conductors whose ends exit from the metallic base of the connectors and pass via holes provided in the mother board in which the connector is mounted, and are soldered to the printed conductors of this mother board, and wherein these holes open onto the other external layer of the mother board between the positions of the two neighbouring electrical and thermal connectors mounted on this other external layer.

5. A system in accordance with any of claims 1 or 2, wherein it comprises electrical and thermal connectors which are installed parallel to each other on the two external layers of a mother board.

6. A system in accordance with any of claims 1 or 2, wherein it comprises rectangular daughter boards with thermal collectors which are inserted by one of their longitudinal edges into electrical and thermal connectors and by the opposite parallel longitudinal edges parallel to the first edge in a board slide.

7. A system in accordance with any of claims 1 or 2, wherein it comprises daughter boards inserted by at least one of their longitudinal edges partially into an electrical and thermal connector and partially into a slide.

8. An electrical cabinet, wherein it is fitted with an electrical and thermal interconnection system in accordance with the above claims 1 or 2.

* * * * *